United States Patent
Fang et al.

(10) Patent No.: US 9,368,644 B2
(45) Date of Patent: Jun. 14, 2016

(54) GATE FORMATION MEMORY BY PLANARIZATION

(71) Applicant: Cypress Semiconductor Corporation, San Jose, CA (US)

(72) Inventors: Shenqing Fang, Sunnyvale, CA (US); Chun Chen, San Jose, CA (US); David Matsumoto, San Jose, CA (US); Mark Ramsbey, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/136,358

(22) Filed: Dec. 20, 2013

(65) Prior Publication Data

US 2015/0179817 A1    Jun. 25, 2015

(51) Int. Cl.
  H01L 21/336    (2006.01)
  H01L 29/792    (2006.01)
  H01L 29/66    (2006.01)
  H01L 29/78    (2006.01)
  H01L 29/423    (2006.01)
  H01L 27/115    (2006.01)

(52) U.S. Cl.
  CPC ........ H01L 29/792 (2013.01); H01L 27/11568 (2013.01); H01L 29/42344 (2013.01); H01L 29/66833 (2013.01); H01L 29/7831 (2013.01)

(58) Field of Classification Search
  CPC .................................................. H01L 27/11563
  USPC ................... 257/314–316, 324; 438/267, 299
  See application file for complete search history.

(56) References Cited

U.S. PATENT DOCUMENTS

| | | | | |
|---|---|---|---|---|
| 4,417,385 A * | 11/1983 | Temple | ................. | H01L 21/033 257/341 |
| 6,462,375 B1 * | 10/2002 | Wu | .................... | H01L 21/28273 257/316 |
| 7,414,889 B2 * | 8/2008 | Lue | .................... | G11C 16/0466 257/E21.209 |
| 7,611,941 B1 * | 11/2009 | Shum | ................ | H01L 21/28273 257/E21.179 |
| 7,939,880 B2 * | 5/2011 | Kang | .................... | B82Y 10/00 257/319 |
| 8,822,289 B2 * | 9/2014 | Fang | ................. | H01L 27/11563 257/316 |

(Continued)

FOREIGN PATENT DOCUMENTS

KR    100998967    12/2010

OTHER PUBLICATIONS

International Search Report for International Application No. PCT/US2014/071524 dated Apr. 20, 2015; 3 pages.

(Continued)

*Primary Examiner* — Earl Taylor (57) ABSTRACT

Semiconductor devices and methods of producing the devices are disclosed. The devices are formed by forming a gate structure on a substrate. The gate structure includes a charge trapping dielectric formed between the substrate and a first poly layer. A top dielectric is formed over the poly layer and a sidewall dielectric is formed on a side of the poly layer. A second poly layer is formed over the gate structure such that a portion of the second poly layer includes a vertical portion that is in contact with the sidewall dielectric and a top portion that is in contact with the top dielectric. The top portion of the second poly layer can then be removed through, for instance, planarization.

10 Claims, 12 Drawing Sheets

(56) References Cited

U.S. PATENT DOCUMENTS

| | | | |
|---|---|---|---|
| 8,836,006 B2* | 9/2014 | Chang | H01L 29/401 257/314 |
| 2005/0085039 A1* | 4/2005 | Yasui | H01L 21/28273 438/257 |
| 2006/0166420 A1 | 7/2006 | Duuren et al. | |
| 2006/0197145 A1 | 9/2006 | Pittikoun et al. | |
| 2006/0205154 A1* | 9/2006 | Hung | G11C 16/0433 438/257 |
| 2008/0073698 A1* | 3/2008 | Ono | H01L 21/28273 257/319 |
| 2008/0073705 A1* | 3/2008 | Hisamoto | G11C 16/0425 257/326 |
| 2009/0045452 A1* | 2/2009 | Lue | G11C 16/0466 257/321 |
| 2009/0224306 A1* | 9/2009 | Hayashi | H01L 21/28282 257/316 |
| 2010/0029052 A1* | 2/2010 | Kang | B82Y 10/00 438/261 |
| 2010/0163953 A1* | 7/2010 | Jeong | 257/315 |
| 2010/0193856 A1* | 8/2010 | Okuyama | H01L 21/28282 257/324 |
| 2011/0006357 A1* | 1/2011 | Tsuji | H01L 29/792 257/324 |
| 2011/0175156 A1* | 7/2011 | Okuyama | H01L 21/28282 257/324 |
| 2012/0217573 A1* | 8/2012 | Kang | B82Y 10/00 257/326 |
| 2014/0097480 A1* | 4/2014 | Shum | H01L 27/11521 257/314 |
| 2014/0175533 A1* | 6/2014 | Kwon | H01L 21/28282 257/324 |
| 2014/0209996 A1* | 7/2014 | Toba | H01L 21/28282 257/326 |
| 2015/0001606 A1* | 1/2015 | Hong | H01L 29/42332 257/316 |
| 2015/0035034 A1* | 2/2015 | Winstead | H01L 29/66833 257/314 |
| 2015/0179817 A1* | 6/2015 | Fang | H01L 29/792 257/326 |

OTHER PUBLICATIONS

Written Opinion of the International Searching Authority for International Application No. PCT/US2014/071524 dated Apr. 20, 2015; 8 pages.

* cited by examiner

GATE FORMATION MEMORY BY PLANARIZATION

BACKGROUND

1. Technical Field

This disclosure relates generally to improved semiconductor devices and methods for making such devices.

2. Related Art

A non-volatile memory, such as Flash memory, retains stored data even if power to the memory is removed. A non-volatile memory cell stores data, for example, by storing electrical charge in an electrically isolated floating gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power application.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. The erased state of the memory gate can be near or in depletion mode (i.e., threshold voltage, Vt, less than zero volt) because the select gate is in series with the memory gate. Even when the erased memory gate is in such depletion mode, the select gate in the off state prevents the channel from conducting substantial current. The threshold voltage in the erase state is established near or below zero, which allows a low the threshold voltage in the programmed state, yielding reasonable read margin between erase and program states. The voltages applied to both select gate and memory gate in read operation can be less than or equal to the supply voltage. Thus, the read operation is faster because the supply voltage need not be pumped to a high level.

It is common to monolithically incorporate multiple types of field-effect devices on the same substrate as memory cells. Those non-memory devices perform, for example, decoding, charge-pumping, and other functions related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate memory cell, with the processing of one or more types of non-memory transistors on the same substrate is challenging as each requires different fabrication parameters. Accordingly, there is a need for device and methods for integrating a memory cell and other devices on the same substrate to facilitate improved cost, performance, reliability, or manufacturability.

BRIEF SUMMARY OF THE INVENTION

A semiconductor device and methods of forming the semiconductor device are disclosed herein. According to embodiments of the method, the device is formed by forming a gate structure on a substrate. The gate structure includes a charge trapping dielectric formed between the substrate and a first poly layer. A top dielectric is formed over the poly layer, and a sidewall dielectric may be formed on a side of the poly layer. A second poly layer can be formed over the gate structure such that the second poly layer includes a vertical portion that is in contact with the sidewall dielectric, and a top portion that is in contact with the top dielectric. The top portion of the second poly layer is then be removed.

According to various embodiments, the semiconductor device includes a substrate and a gate structure. The gate structure can be formed on the substrate. The gate structure includes a charge trapping dielectric that is formed between the substrate and a first poly layer and a sidewall dielectric and formed on a side of the poly layer. A second poly layer is formed adjacent to the gate structure. The second poly layer includes a vertical portion in contact with the sidewall dielectric and has a top portion that is substantially flat.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

The features and advantages of embodiments of the present invention will become more apparent from the detailed description set forth below when taken in conjunction with

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

Figure 1:
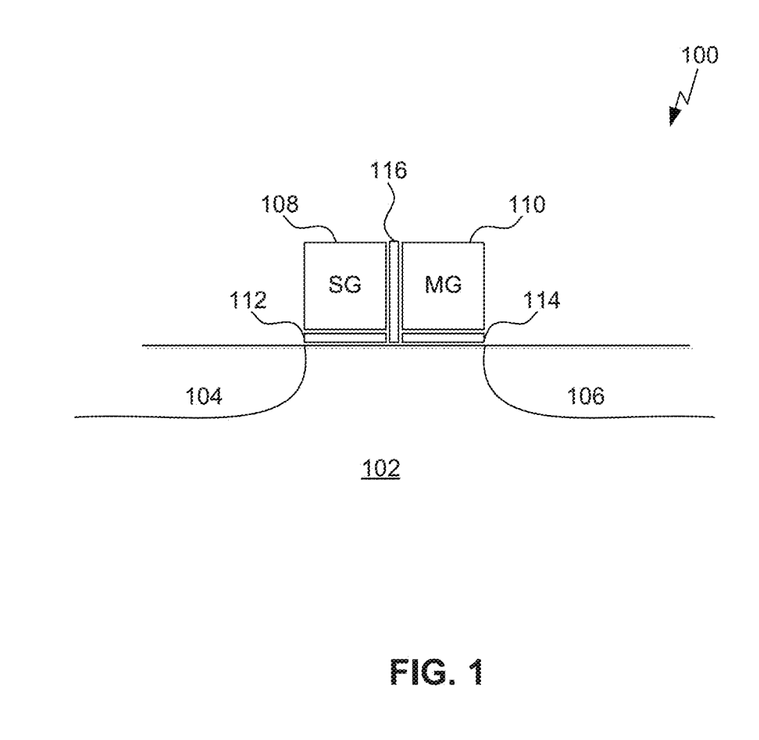
FIG. 1 depicts a cross-section of a split-gate memory cell according to various embodiments.

FIG. 1 illustrates an example of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may comprise a gate conductor such as a doped poly layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a charge trapping silicon nitride layer sandwiched between two silicon dioxide layers to create a three-layer stack collectively and commonly referred to as "ONO." Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied To region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and three volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
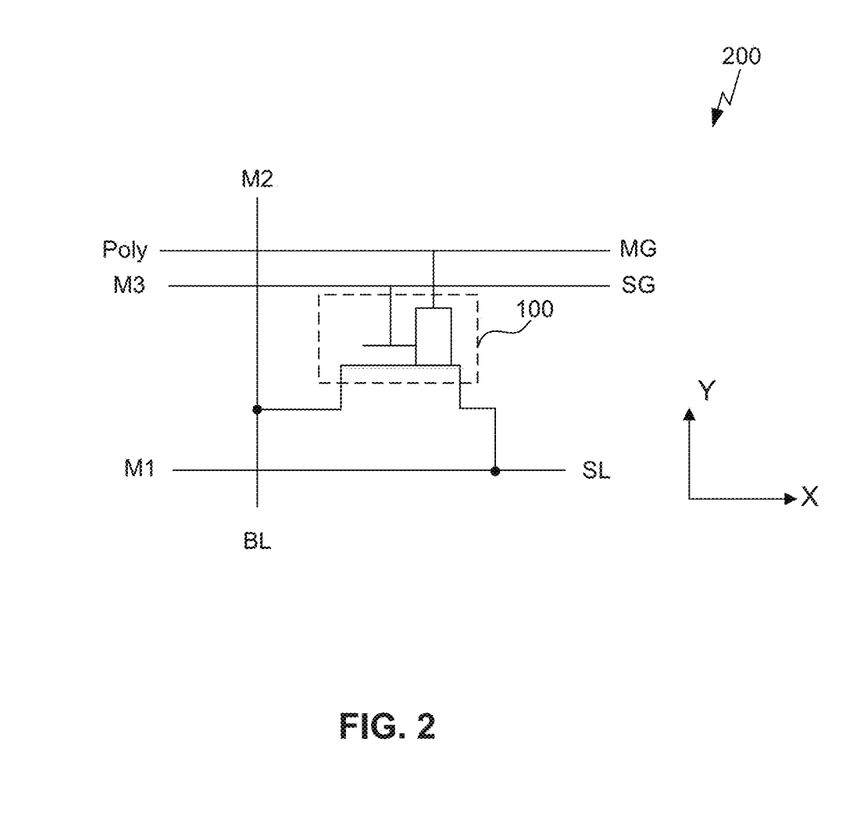
FIG. 2 is a circuit diagram of a memory cell in a memory array according to various embodiments.

FIG. 2 illustrates an example circuit diagram 200 that comprises a memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
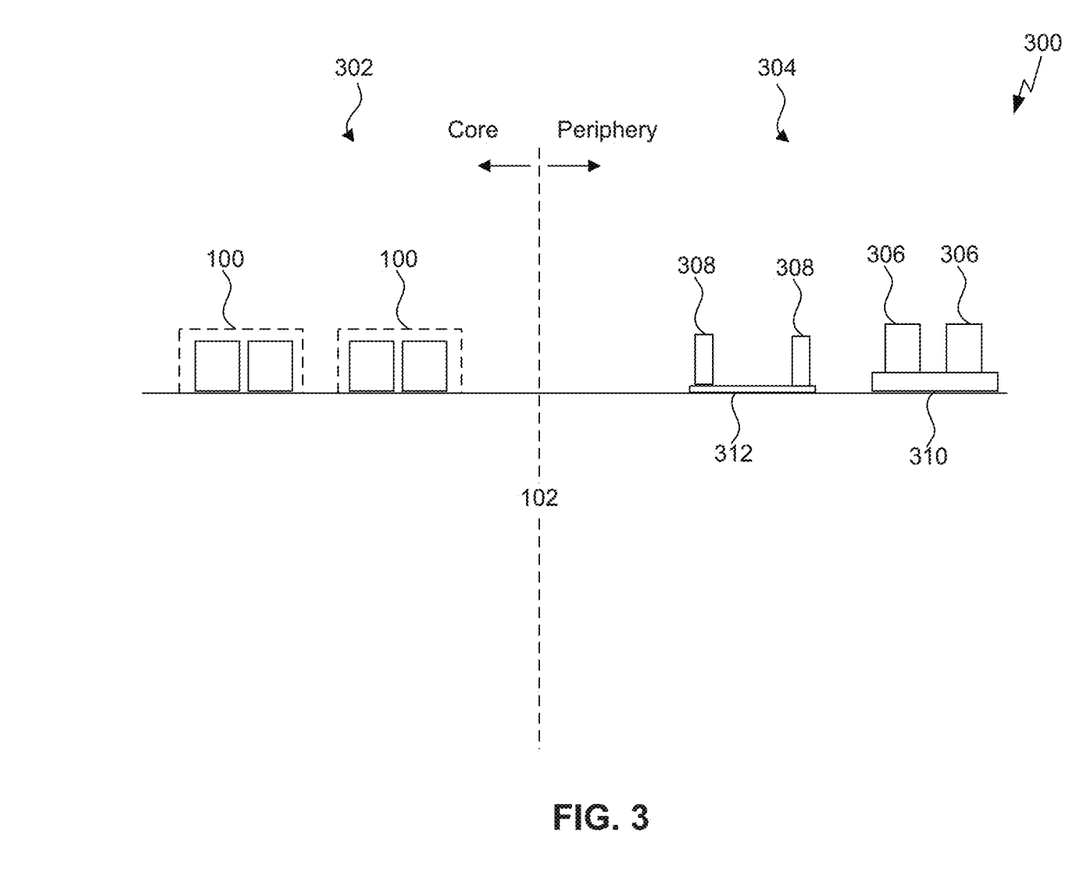
FIG. 3 depicts a cross-section of a semiconductor device according to various embodiments.

FIG. 3 illustrates an example semiconductor device 300 that includes both memory circuitry 302 and peripheral circuitry 304 in the same substrate 102. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Substrate 302—and indeed substrates in general as used throughout the description—can be silicon according to various embodiments. However, the substrate 302 may also be any of a wide array of semiconductor materials such as germanium, gallium arsenide, indium phosphide, etc. In other embodiments, the substrate 302 may be electrically non-conductive such as a glass or sapphire wafer.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308. As shown in FIG. 3, low voltage transistors 308 have a narrower width than high-voltage transistors 306, but this need not be the case. According to some embodiments, low-voltage 308 transistors can be wider than high voltage transistors 306 or, alternatively, low-voltage transistors 308 and high-voltage transistors 306 can have the same width.

During the descriptions herein, various regions of the substrate upon which the field-effect devices are fabricated are mentioned. For instance, with respect to FIG. 3, core region 302 and periphery region 304 were described. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

Figure 4:
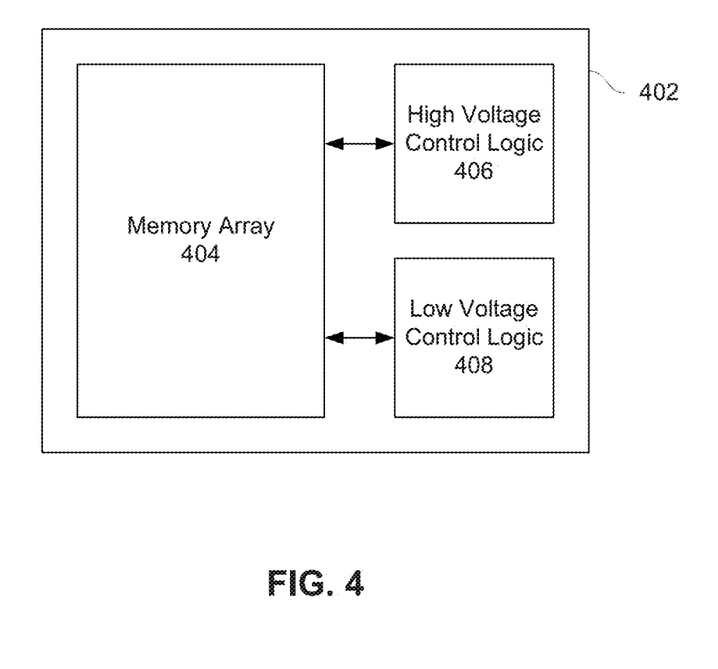
FIG. 4 is a functional block diagram of a memory device according to various embodiments.

FIG. 4 is a functional block diagram of a memory device 402 according to embodiments of the present invention. As shown, memory device 402 includes a memory array 404, high voltage control logic 406, and low voltage control logic 408. According to various embodiments, the memory array 404 may comprise a number of memory cells 100 and may be physically located in a core region 302 of memory device 402. High voltage control logic 406 may comprise a number of high-voltage transistors 306, which can be used to control and/or drive portions of the memory array 404. Additionally, the high voltage control logic 406 may be physically located in the periphery 304 of the memory device 402. Similarly to the high voltage control logic 406, the low voltage control logic 408 may comprise a number of low voltage transistors 308, which can be used to control and/or drive portions of the memory array 404. The low voltage control logic 408 may also be located in the periphery 304 of the memory device. According to various embodiments, the high voltage control logic 406 and the low voltage control logic 408 are located in different portions of the periphery region 304.

Figure 5A:
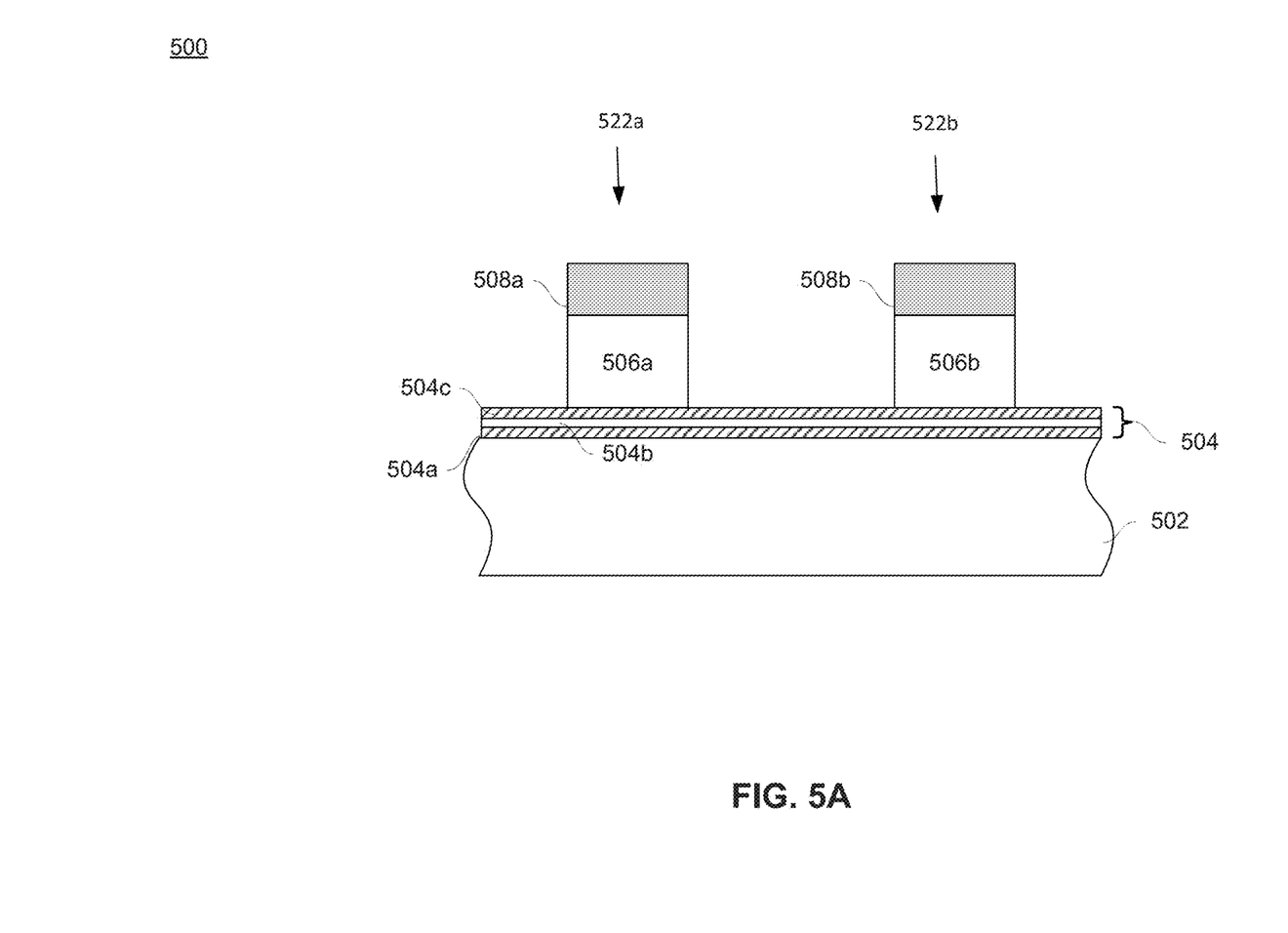
FIGS. 5A-5G depict cross sections of an exemplary semiconductor device at various points during its manufacture according to various embodiments.

FIGS. 5A-5G depict a cross section of a semiconductor device 500 at various points in its manufacture according to various embodiments. FIG. 5A depicts device 500 after a number of structures have been formed. As shown in FIG. 5A, the device 500 includes gate structures 522a and 522b (collectively 522) formed over a substrate 502. Each of gate structures 522a and 522b is formed over a charge trapping dielectric 504, itself, may comprise several layers 504a, 504b, and 504c. Each of the layers 504a, 504b, and 504c of the charge trapping dielectric 504 may comprise any suitable dielectric material such as, for instance oxide. According to various embodiments the layers 504a, 504b, and 504c may be different thicknesses, but this need not be the case indeed according to various embodiments some or all of the layers 504a, 504b, and 504c may be the same thickness. Charge trapping dielectric 504 may be formed through any well-known method. For instance, the dielectric 504 is grown on the substrate 502 and comprise an oxide of the substrate material (e.g., silicon oxide). It is also possible, however, for the charge trapping 504 dielectric to be disposed on the substrate and comprises an oxide of a different material than the substrate. Additionally, the charge trapping dielectric may comprise the same or different material and may be formed at the same time or at different times according to various embodiments. According to various embodiments, the charge trapping dielectric 504 comprises one or more layers of dielectric such as ONO, as described above. For instance, the charge trapping dielectric 504 may comprise a first dielectric layer 504aa, a charge trapping layer 504b, and a second dielectric layer 504c. Regardless of the specific composition of the charge trapping dielectric 504, it preferably contains at least one charge trapping layer 504b. Such a charge trapping layer is formed of a nitride or silicon rich nitride, and may include multiple layers of different nitrides according to some embodiments.

Each of the gate structures 522a and 522b includes a conductor layer 506a and 506b (collectively referred to as 506). The conductor layer 506 is disposed or deposited according to any appropriate well-known method such as deposition. Deposition may comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

A cap layer 508a and 508b (collectively 508) is formed of conductive layers 506a and 506b in each of the gate structures 522a and 522b. According to various embodiments, the cap layer 508 comprises a dialectic such as nitride.

Figure 5B:
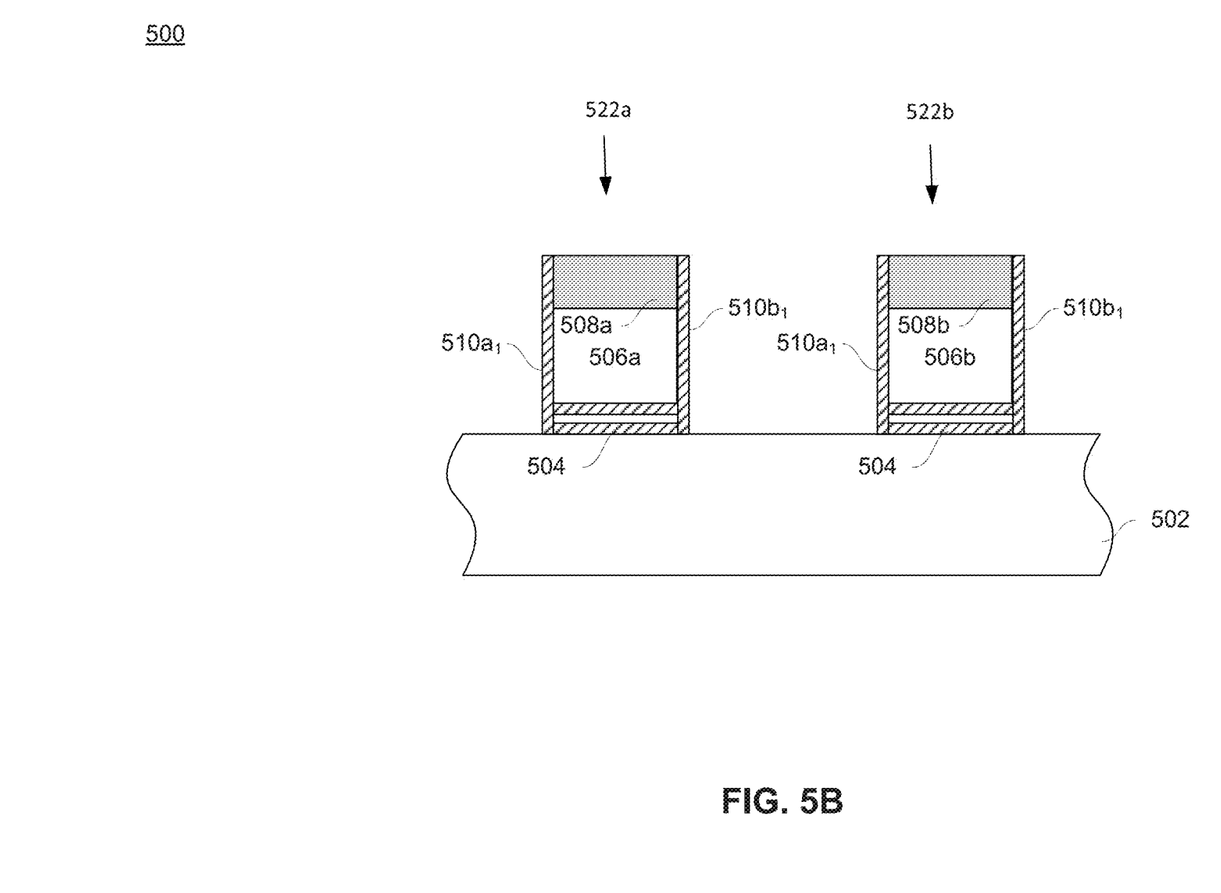

FIG. 5B depicts semiconductor device 500 at a different point in its manufacture according to various embodiments. As shown in FIG. 5B, portions of the charge trapping dielectric 504 have been removed from the substrate 502. Specifically, the portions of charge trapping dielectric 504 not beneath structures 522a and 522b have been removed. According to some embodiments, the portions of the charge trapping dielectric 504 can be removed using any appropriate etching method using, instance, Cl2, KOH, TMAH (tetra-methyl-amino-hydroxyl), or using gas phase etching with, for instance, H2, HCl, O2, H2O (vapor or gas), O3, HF, F2, and Carbon-Fluoride compounds with Cl2 and XeF2. Additionally, according to some embodiments, a combination of etching products may be used.

In addition to depicting the removal of portions of the charge trapping dielectric 504, FIG. 5B depicts sidewall dielectrics $510a_1$, $510a_2$, $510b_1$, and $510b_2$ ($510a_2$ and $510b_2$ in FIG. 5B) that have been formed on the sides of gate structures 522a and 522b. While FIG. 5B depicts the formation of the device 500 with sidewall dielectrics $510a_1$, $510a_2$, $510b_1$, and $510b_2$ on each side of gate structures 522a and 522b, it is possible to omit the formation of some of the sidewalls dialectics. For instance, according to some embodiments, only sidewall dielectrics $510a_1$ and $510b_1$ are formed. According to various embodiments, the sidewall dielectrics $510a_1$, $510a_2$, $510b_1$, and $510b_2$ may comprise a single layer dielectric or a multiple layer dielectric such as ONO, described above.

Figure 5C:
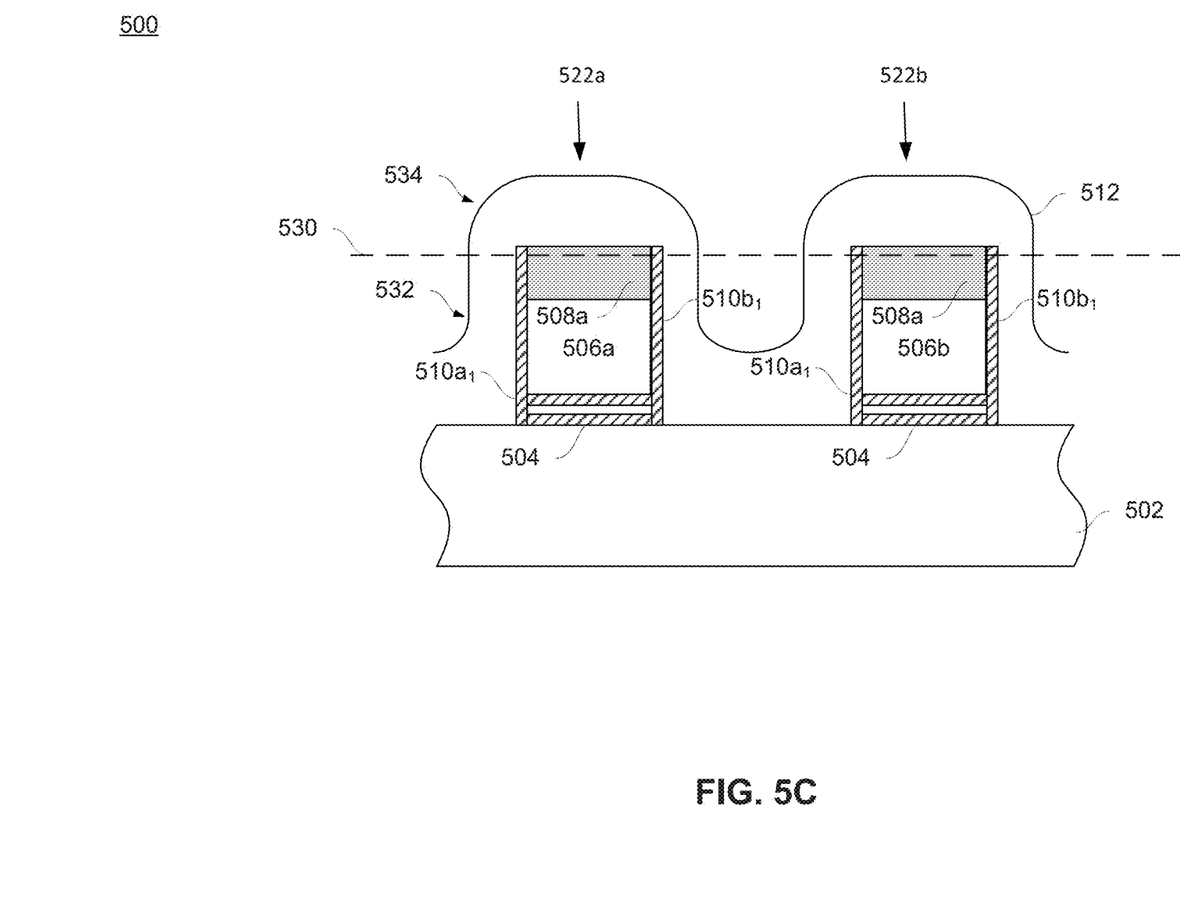

FIG. 5C depicts semiconductor device 500 at a different point during its manufacture according to various embodiments. As shown in FIG. 5C, a conducting layer 512 is formed substantially conformally over gate structures 522a and 522b, however, this need not be the case. For instance, according to some embodiments, conducting layer 512 may be non-conformal. According to various embodiments, the gate conducting layer 512 may be disposed or deposited according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The conducting layer 512 includes a top portion 534 and one or more vertical portions 532. The top portion 534 lies above dividing line 530 and the one or more vertical portions 532 lie below dividing lines 530. The vertical portion 534 is disposed adjacent to the sidewall dielectrics $510a_1$, $510a_2$, $510b_1$, and $510b_2$. For instance, as shown in FIG. 5C, vertical portion 532 is adjacent to sidewall dielectric $510a_1$. Top portion 534 includes any portion of the conducting layer 512 that is disposed above dividing line 530. However, as shown in FIG. 5C, the top portion includes a portion of the cap layers 508 and the sidewall dielectrics $510a_1$, $510a_2$, $510b_1$, and $510b_2$.

Figure 5D:
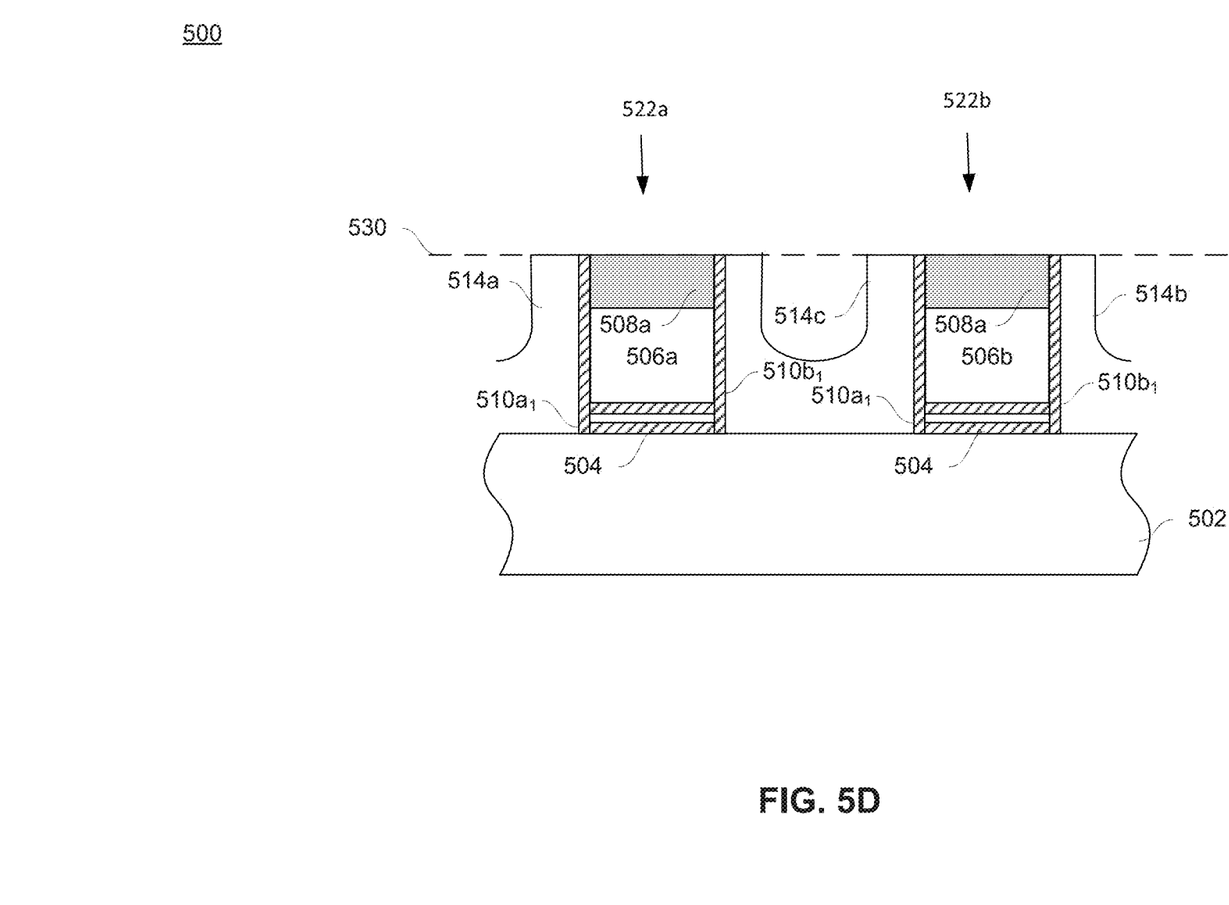

FIG. 5D depicts device 500 at a different point during its manufacture according to various embodiments. As shown in FIG. 5D, the top portion 532 (e.g., the portion of the conducting layer 512 above dividing line 530) is removed creating three separate portions of conducting layer 512: 514a disposed to the left of gate structure 522a; 514b disposed to the right of gate structure 522b; and 514c disposed between gate structures 522a and 522b. According to various embodiments, the separate portions 514a, 514b, and 514c of conducing layer 512 are created by planarization of the conducing layer 512 such that it is flush with cap layers 508a and 508b. According to various embodiments, the planarization comprises poly chemical mechanical planarization (CMP). Other suitable methods such as coat planarization material and a dry etch-back. A thin oxide may optionally be disposed on device 500 according to various embodiments.

Figure 5E:
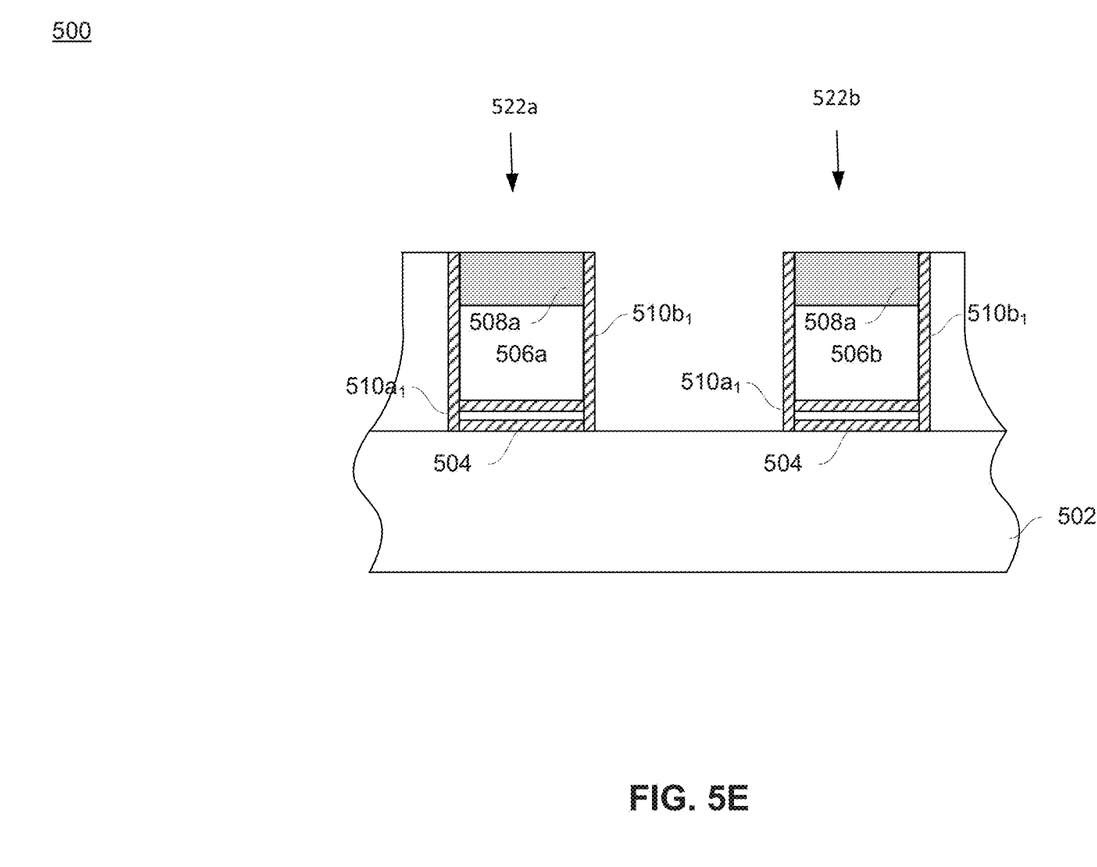
Figure 5F:
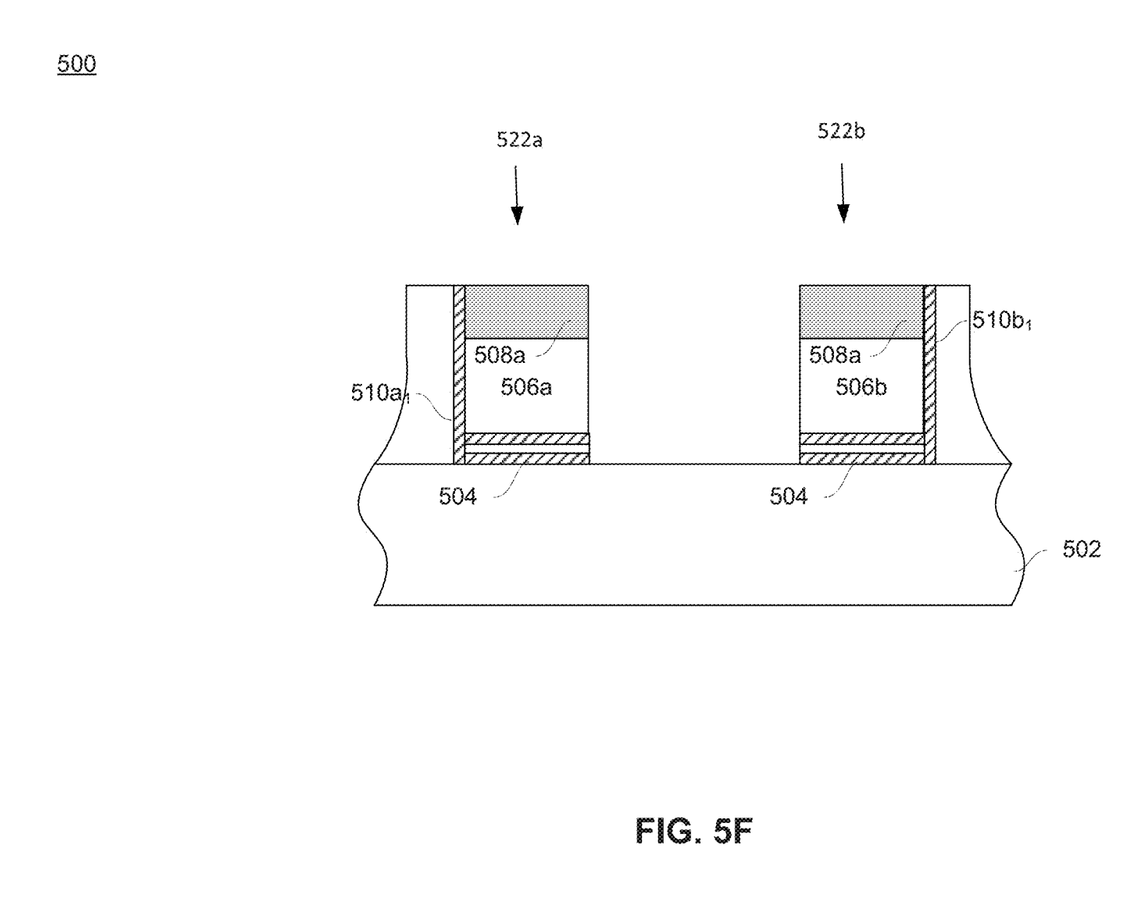

FIG. 5E depicts device 500 at a different point during its manufacture according to various embodiments. As shown in FIG. 5E, portions 514a and 514b are etched to remove excess conducting layer 512 material. After the etching, the thin oxide is removed. At this point, the substrate to the left of portion 514a and to the right of portion 514b are doped as a drain so that portions 514a and 514b can function as select gates. Additionally, portion 514c is entirely removed from device 500 with a mask that covers 510a1 and 510b1, and some of 506a and 506b. While not necessary, it is also possible to remove sidewall dielectrics $510a_2$ and $51b_2$, as depicted in FIG. 5F. At this point, if device 500 will be used as a split gate memory cell, the substrate in between the gate structures 522a and 522b are doped as a source whereby conductor layers 506a and 506b can function as memory gates.

Figure 5G:
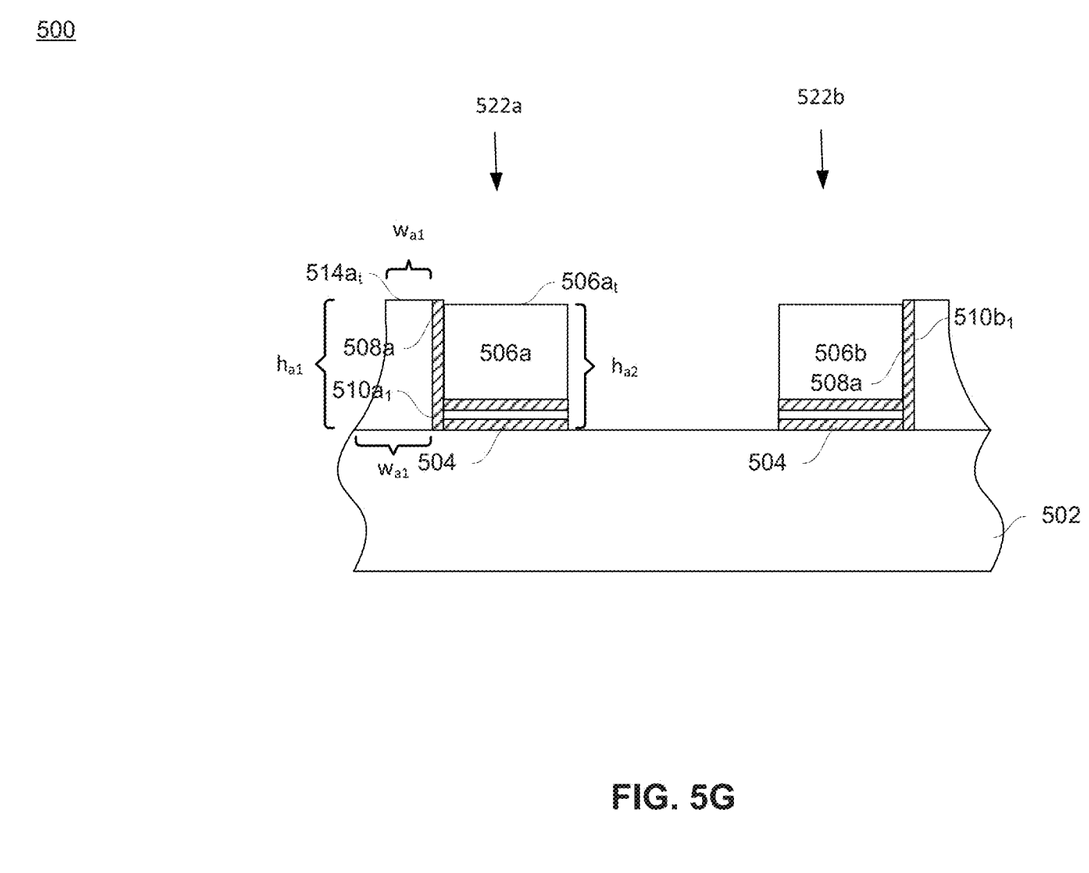

FIG. 5G depicts device 500 at a different point during its manufacture according to various embodiments. As shown in FIG. 5G, the caps 508a and 508 be have been removed from the gate structures 522a and 522b. Additionally, the now-select gates 514a and 514b are further etched to shorten them, if desired. With the removal of the caps 508a and 508b, the height of the select gates 514a and 514b is substantially the same as the height of the gate structures 522a and 522b. However, according to some embodiments, it is possible that the height of the two is not exactly the same. For instance, as shown in FIG. 5G, the height of memory gate 522a, $h_{a2}$, is less than the height of the select gate 514a, $h_{a1}$. The top of the now-memory gate $506a_t$ is depicted as not being flush with the top of select gate $514a_t$ in FIG. 5G. While this is an acceptable embodiment, it is also possible to form the tops $506a_t$ and $514a_t$ as flush with one another. At this point, the combination of gate structure 522a and select gate 514a as well as the combination of gate structure 522b and select gate 514b can be configured to function as memory cells according to well-known methods.

Figure 6:
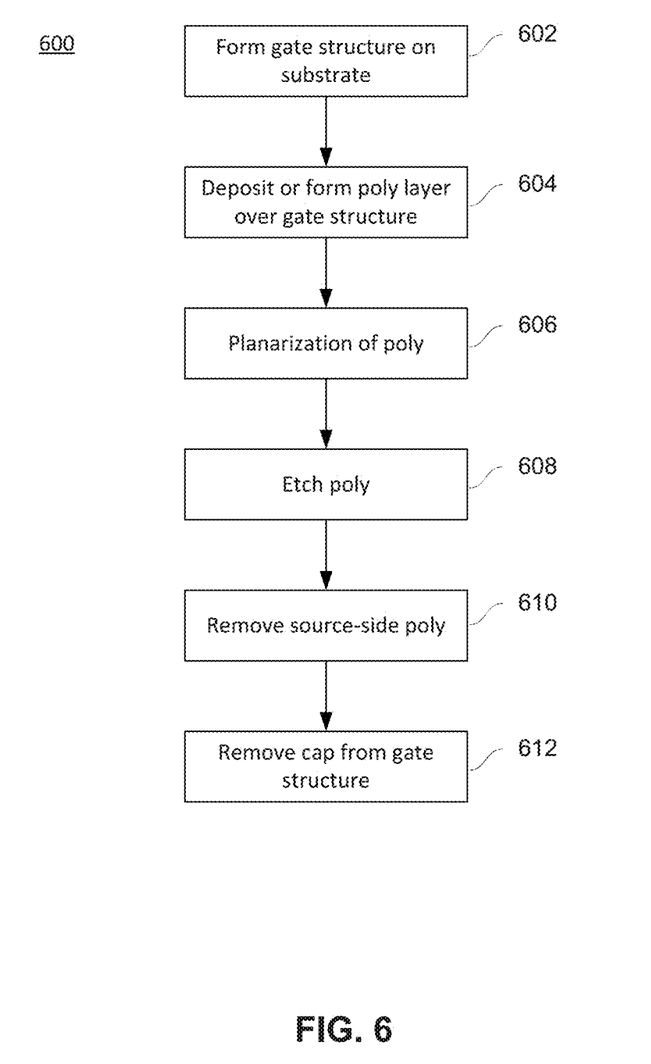
FIG. 6 is a flowchart depicting a method of manufacturing a semiconductor device according to various embodiments.

FIG. 6 depicts a method 600 of forming a semiconductor device 500 according to various embodiments. While the steps of method 600 will be discussed with respect to FIGS. 5A-5G, the specific embodiments described therein should not be viewed as limiting. Indeed, any number of other embodiments consistent with the spirit and scope of this disclosure are possible.

As shown in FIG. 6, a gate structure 522 is formed on a substrate 502 at step 602. The gate structure 522 is formed over a charge trapping dielectric 504, which comprises several layers 504a, 504b, and 504c. Layers 504a, 504b, and 504c of the charge trapping dielectric 504 comprise any suitable dielectric material such as, for instance and oxide. The gate structure 522 includes a conductor layer 506 disposed above the charge trapping dielectric 504 and a cap layer 508 disposed above the conductor layer 506. A sidewall dielectric 510 is formed on the gate structure 522.

At step 604, a second conducting layer 512 are formed over the gate structure 522. Conducting layer 512 is formed substantially conformally over gate structure 522 or, in the alternative, non-conformally according to various embodiments.

At step 606, the conducting layer 512 is planarized to remove the top portion of the conducting layer 512 thereby leaving the remaining conducing layer 512 flush with the top of conductor layer 506. According to various embodiments, the planarization comprises poly chemical mechanical planarization (CMP). Other suitable methods such as coat planarization material and a dry etch-back can be used. A thin oxide may optionally be deposited on device 500 at this point according to various embodiments.

At step 608, the poly is further etched to remove excess drain-side poly 514c and the source side poly 514a is further etched to remove excess at step 610 with a mask. The cap 508 is removed from the gate structure at step 612.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. Additionally, it should be understood that none of the examples or explanations contained herein are meant to convey that the described embodiments have been actually reduced to practice.

The breadth and scope of the present invention should not be limited by any of the above-described exemplary embodiments, but should be defined only in accordance with the following claims and their equivalents.

What is claimed is:

1. A method of forming a semiconductor device, comprising:
   forming, on a substrate, a gate structure that includes a charge trapping dielectric formed between the substrate and a first poly layer, a top dielectric formed over the first poly layer, and a sidewall dielectric formed on a first side of the first poly layer and on a second side of the first poly layer, wherein the second side is an opposite side from the first side;
   forming a second poly layer over the gate structure such that the second poly layer includes a vertical portion that is in contact with the sidewall dielectric and a top portion;
   removing the sidewall dielectric formed on the second side of the first poly layer; and
   removing the top portion of the second poly layer.

2. The method of claim 1, further comprising depositing a thin oxide between the top dielectric and the second poly layer.

3. The method of claim 1, wherein the top portion of the second poly layer is removed using chemical-mechanical planarization.

4. The method of claim 1, wherein the top portion of the second poly layer is removed using planarization and dry etch back.

5. The method of claim 1, wherein the charge trapping dielectric comprises an oxide layer and a nitride layer.

6. The method of claim 1, wherein the top dielectric comprises a nitride.

7. The method of claim 1, further comprising removing the top dielectric.

8. The method of claim 7, further comprising removing a portion of the vertical portion adjacent to the top dielectric along with the top dielectric.

9. The method of claim 1, further comprising forming a memory gate from the gate structure.

10. The method of claim 1, further comprising forming a select gate from the vertical portion.

\* \* \* \* \*